United States Patent
Sellmair

(10) Patent No.: US 7,345,436 B2
(45) Date of Patent: Mar. 18, 2008

(54) APPARATUS AND METHOD FOR CONTROLLING THE BEAM CURRENT OF A CHARGED PARTICLE BEAM

(75) Inventor: Josef Sellmair, Freising (DE)

(73) Assignee: ICT Integrated Circuit Testing Gesellschaft, Heimstetten (DE)

( * ) Notice: Subject to any disclaimer, the term of this patent is extended or adjusted under 35 U.S.C. 154(b) by 62 days.

(21) Appl. No.: 10/552,296

(22) PCT Filed: Mar. 29, 2004

(86) PCT No.: PCT/EP2004/003329

§ 371 (c)(1),
(2), (4) Date: Jun. 16, 2006

(87) PCT Pub. No.: WO2004/088709

PCT Pub. Date: Oct. 14, 2004

(65) Prior Publication Data

US 2007/0023672 A1 Feb. 1, 2007

(30) Foreign Application Priority Data

Apr. 3, 2003 (EP) .................................. 03007685

(51) Int. Cl.
*H01J 3/14* (2006.01)
*H01J 3/02* (2006.01)
*H01J 49/08* (2006.01)

(52) U.S. Cl. ...................... 315/507; 315/500; 315/505; 313/363.1; 250/396 R; 250/398

(58) Field of Classification Search ...................... None
See application file for complete search history.

(56) References Cited

U.S. PATENT DOCUMENTS 5,440,210 A * 8/1995 Bogaty et al. ............... 315/383
5,478,698 A 12/1995 Zelayeta et al.
2001/0017739 A1 8/2001 Krans et al.

FOREIGN PATENT DOCUMENTS

EP 1300870 A 4/2003
WO WO98/48443 A 10/1998

* cited by examiner

Primary Examiner—Nikita Wells
(74) Attorney, Agent, or Firm—Patterson & Sheridan, L.L.P.

(57) ABSTRACT

An apparatus for producing a beam of charged particles is provided, which comprises an emitter (1, 2) and a switching device (3) adapted to switch between first, second and third beam current levels, wherein the beam current at said first current level is suitable for writing a pixel of an image on the surface of a sample, the beam current at said second current level is suitable for not writing a pixel on the surface of said sample, and the beam current at said third current level is lower than the beam current at the second current level. Furthermore, a method of controlling the beam current of a charged particle beam is provided, comprising the steps of switching the beam current of said charged particle beam between first and second current levels, wherein the beam current at said first current level is suitable for writing a pixel of an image on the surface of a sample and the beam current at said second current level is suitable for not writing a pixel on the surface of said sample, and switching the beam current to a third voltage level, wherein the beam current at said third current level is lower than the beam current at the second current level.

21 Claims, 2 Drawing Sheets

APPARATUS AND METHOD FOR CONTROLLING THE BEAM CURRENT OF A CHARGED PARTICLE BEAM

FIELD OF THE INVENTION

The present invention relates to an apparatus and a method for controlling the beam current of a charged particle beam, especially for the improved control of the extinction ratio in electron beam apparatus using emitter arrays.

BACKGROUND OF THE INVENTION

Technologies like microelectronics, micromechanics and biotechnology have created a high demand in industry for structuring and probing specimens within the nanometer scale. On such a small scale, probing or structuring, e.g. of photomasks, is often done with electron beams which are generated and focused in electron beam devices like electron microscopes or electron beam pattern generators. Electrons beams offer superior spatial resolution compared to e.g. photon beams due to their short wave lengths at a comparable particle energy.

While electron beam devices can meet the spatial resolution requirements they are often too slow to deliver the throughput needed in large scale manufacturing. To overcome the throughput limitations, electron beam devices with multiple beams have been proposed with various designs. Such electron multiple beam devices with higher electron beam density usually rely on arrays of field emission cathodes where the field emission cathodes are integrated onto a substrate. Such field emission cathode arrays are fabricated by using micromechanical or microelectronic fabrication techniques. They usually comprise an array of emitter tips and an array of extracting electrodes with extracting electrode and emitter tip facing each other one to one. In electron beam devices with such an array of emitter tips, a single pixel of an image to be written on the surface of a sample may be represented by a single emitter tip.

During pattern writing or inspection, the electron beam is moved over the surface of the sample in substantially parallel write scan lines. An electron-sensitive resist deposited on the sample surface is partly exposed to the electron beam. The electron beam changes the molecular composition of the resist, thus making it soluble in a developing solution, if the exposure dose, i.e. the temporarily integrated beam current, is sufficiently large. Subsequently, the exposed portions of the resist are removed and the layers underlying the resist can be etched in the regions where the resist has been removed.

The beam current of the electron beam varies with position since only predetermined pixels on the write scan line are to be exposed to write a predetermined pattern. Therefore, the electron beam has to be turned on for writing and turned off for not writing a pixel. This switching has to be done very fast to achieve a reasonable throughput. One way of switching on and off the electron beam is to switch on and off the emitter tip itself which is done by switching the tip-to-gate voltage, i.e. the voltage difference between the emitter tip and the gate electrode, from a low "tip off" voltage level to a high "tip on" voltage level. The ratio of the "tip off" current to the "tip on" current is called the extinction ratio.

In known electron beam apparatus, the extinction ratio is about $10^{-2}$, i.e. the "tip on" current is about $10^2$ times larger than the "tip off" current. For considerably larger extinction ratios, a variation of the critical dimension (CD) could occur since the residual "tip off" current still contributes to the exposure dose and thereby increases the line width of the pattern. This effect is most critical at locations where the electron beam spot is moving slowly across the sample surface, i.e. especially during the write scan turn at the beginning or end of each new write scan line. The temporarily integrated exposure dose of the "tip off" current may become too large in the turn regions and lead to variations of the critical dimension (CD) or other undesired results. Therefore, some apparatus known in the art use an additional blanker, i.e. a device for electrically deflecting the electron beam away from the sample to avoid these CD variations.

Furthermore, the voltage swing of the emitter tip has to be relatively high, e.g. several tens of volts for present tip geometries to achieve the desired extinction ratio. This relatively high voltage swing causes the "tip on"/"tip off-"switching of emitter tips to be slow and, consequently, limits the throughput. Furthermore, the heat load of interconnects and integrated electronics as well as the in-vacuum power dissipation are relatively high since the tip current depends approximately exponentially on the tip-to-gate voltage.

SUMMARY OF THE INVENTION

It is therefore an object of the present invention to provide an improved apparatus and method for controlling the beam current of a charged particle beam, especially an apparatus and method for controlling the beam current of a charged particle beam which overcomes at least part of the aforementioned problems.

These and other objects are solved by an apparatus according to claim 1 and a method according to claims 7 and 14. Further advantages, features, aspects and details of the invention are evident from the dependent claims, the description and the accompanying drawings. The claims are intended to be understood as a first non-limiting approach of defining the invention in general terms.

According to an aspect of the present invention, an apparatus for producing a beam of charged particles is provided which comprises a charged particle source and a device for switching between write, blank and mute levels of the beam current, wherein the write level is adapted for writing a pixel of an image on the surface of a sample, the blank level is adapted for not writing a pixel on the surface of said sample, and the mute level is adapted for an even lower exposure rate than the blank level.

The above described apparatus is adapted to switch not only between two but three tip-to-gate voltage levels. The additional mute level needs to be switched only faster than the relatively low scan frequency. Therefore the corresponding voltage swing can be large without causing excessive heat load or in-vacuum power dissipation. Furthermore, the beam current is sufficiently low at the mute level to prevent CD variations due to unwanted exposure doses in regions where the beam spot speed is slow. Also, heat load is reduced since fast switching can be accomplished with a small voltage swing between the write and blank levels. Although the term write level is used, it should be understood that the apparatus according to the aspect of the present invention can also be used for inspecting sample instead of structuring them.

According to an embodiment of the present invention, the difference in tip-to-gate voltage of the emitter is smaller or equal to 5 V between said write and blank levels, and the difference in tip-to-gate voltage is larger or equal to 10 V, preferably about 15 V, between said blank and mute levels.

The tip-to-gate voltage of an emitter tip can be switched very fast by 5 V at a pixel clock frequency, thus leading to a considerable throughput and an acceptable heat load. On the other hand, the 15 V voltage swing between blank and mute levels can be switched slower and heat load or capacitive load are prevented.

According to a further aspect of the present invention, a method of controlling the beam current of a charged particle beam is provided, comprising the steps of switching the beam current of said charged particle beam between a write level for illuminating a pixel on the sample surface and a blank level at which the exposure dose is not sufficient for writing a pixel, and switching the beam current to a mute level at which the exposure dose is considerably below the exposure dose at the blank level.

The blank level provides a beam current which is sufficiently low for not writing a pixel at the write scan speed of the beam spot, but high enough so that the voltage swing between the write level and the blank level is relatively small. By this measure, high switching speed and low heat load and power dissipation are achieved during pixel writing. Since the beam current at the blank level is too high for the slow movement of a write scan turn, a mute level of considerably lower beam current is provided. At the mute level, the beam current is so low that even the slow write scan turn does not lead to any CD variations or other undesired results due to the exposure dose by the residual "tip off" current. Accordingly, the aforementioned problems related to CD variation, heat load and power dissipation are avoided or at least reduced.

According to another embodiment of the present invention, the extinction ratio of said blank and write levels is smaller or equal to $10^{-2}$, and according to a further embodiment of the present invention, the extinction ratio of said mute and write levels is smaller or equal to $10^{-4}$.

Since the electron beam moves fast at write scan speed, the extinction ratio of write and blank levels can be as high as $10^{-2}$ without deteriorating the image writing result. However, this extinction ratio is not sufficient for the slow beam spot movement at the write scan turns. Therefore, the extinction ratio of the mute and write levels is about $10^{-4}$ and, thus, no CD variations or other undesired results occur in the write scan turn regions when the current is at the mute level.

According to still another aspect of the present invention, a method of controlling the beam current of a charged particle beam is provided, wherein the charged particle beam is produced by a field emission cathode, which method further comprises the steps of switching the tip-to-gate voltage of said field emission cathode between a write level for illuminating a pixel on the sample surface and a blank level at which the temporarily integrated dose is not sufficient for writing a pixel, and switching the tip-to-gate voltage to a mute level at which the temporarily integrated dose is considerably below the temporarily integrated dose at the blank level.

Field emission cathodes are advantageous for their capability of miniaturization and mass production. Also, different levels of the beam current can be realized by a relatively simple switching of the tip-to-gate voltage of an individual field emission cathode in an emitter array. Accordingly, the present invention is especially useful in applications where emitter arrays are used. Thus, the above embodiment of the present invention is technically and economically promising.

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

Figure 1:
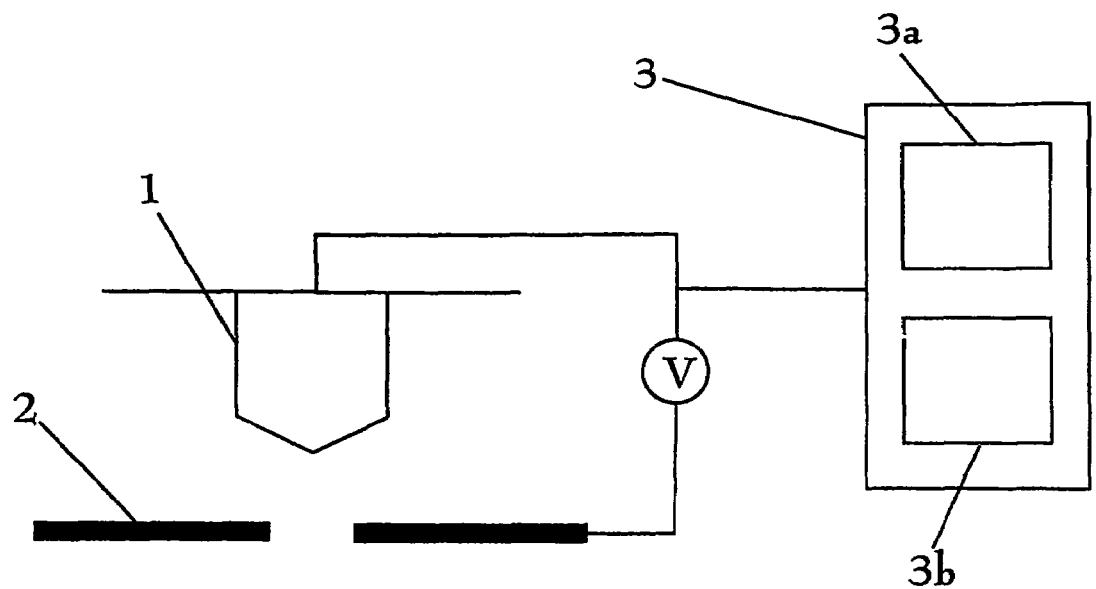
FIG. 1 is a schematic view of an electron emitter tip together with a switching device according to the present invention.

FIG. 1 is a schematic view of a field emission cathode. Field emission cathodes are known electron beam sources for electron beam devices in applications as diverse as e.g. electron microscopy, electron pattern generators or flat panel displays. They were first proposed by C. A. Spindt (Journal of Appl. Physics, Vol 39 (1968) No. 7, p. 3504-3505). The main elements of the cathode are a very tiny emitter tip 1 and a gate 2. The field emission cathode emits electrons into free space by applying a high electric field to the surface of the emitter tip 1. Without electric field there is usually a potential barrier of theoretically infinite thickness at the interface of the emitter tip and free space or vacuum. The height of the potential barrier depends on the surface material of the emitter tip. When an external electric field is applied to the emitter tip that attracts electrons, the potential barrier thickness reduces. When the electric field at the surface of the emitter tip is larger than ca. $10^8$ V/m, the potential barrier thickness reduces to a level where electrons in the emitter tip succeed in tunneling through the potential barrier into free space. This phenomenon is called field emission, in contrast to electron emission caused by e.g. thermal excitation, photo-effect etc.

Usually the high electric field is generated by applying a voltage between the emitter tip 1 and the gate 2 which is an extracting electrode facing the emitter tip. This tip-to-gate voltage is typically in the range of 0 V to 50 V. In order to achieve sufficient field strength at the emitter tip, the electron emitting surface of the emitter is in the shape of a sharp tip (tip radius typically 1 nm to 100 nm). As an example, a tip-to-gate voltage of 25 V may produce a beam current of about 10 nA at the "tip on" level, a tip-to-gate voltage of 20 V may produce a beam current of about 100 pA at the "tip off" level, and a tip-to-gate voltage of 5 V may produce a beam current of about 1 pA.

When the tip-to gate voltage is at the "tip on" level, e.g. 25 V, the beam current of the emitter tip is high enough for exposing the resist to a dose sufficient for writing a pixel (write level of the beam current). When the tip-to gate voltage is at the "tip off" level, e.g. 20 V, the exposure dose is not sufficient for writing a pixel (blank level of the beam current). In the above considerations, the speed at which the electron beam spot moves over the sample surface has to be taken into account since the exposure dose at a predetermined position is given by the temporarily integrated beam current at that position. Namely, a constant exposure dose can be maintained by increased beam currents at a higher speed or by decreased beam currents at a lower speed.

The apparatus shown in FIG. 1 further comprises a switching device 3 for switching between the different levels of beam current or tip-to-gate voltage, respectively. Typically, this switching device 3 is an integrated circuit which may be positioned directly above the emitter tip 1 and can be manufactured in the same process together with the emitter tip. As another possibility, the switching device 3 can also be disposed separate from the emitter tip 1 or a whole array of emitter tips. Preferably, the switching device 3 comprises two parts, a small voltage switching part 3a and a large voltage switching part 3b. The small voltage switching part 3a is adapted to switch only a relatively small voltage, e.g. 5 V or smaller, but to switch very fast, i.e. typically at a pixel clock frequency. This pixel clock frequency determines the time intervals, e.g. 1 ns, within individual pixels are written. The large voltage switching part 3b is adapted to switch a larger voltage, e.g. about 10 V to 15 V, as compared to the relatively small voltage switched by the small voltage switching part 3a. Additionally, the large voltage switching part 3b is adapted to switch the large voltage slower, e.g. within 10 ns to 20 ns, than the small voltage switching part 3a switches the small voltage. Thus, heat load and capacitive load are prevented since the large voltage swing caused by the switching of the large voltage switching part 3b occurs on a much larger time scale than the fast pixel on/off switching of the small voltage switching part 3a. On the other hand, also the fast switching of the small voltage switching part 3a does not cause problems due to excessive heat load, capacitive load or charging since the voltage swing is relatively small. Preferably, the small voltage switching part 3a and the large voltage switching part 3b are formed as two parts of an integrated circuit. Although both parts are shown separate from each other in FIG. 1, they can share some of the circuitry.

The switching between the different current levels can be accomplished by either gate switching or tip switching or a combination of both, wherein each of these concepts may be applied separately to the small voltage switching part 3a and the large voltage switching part 3b. Especially, it is possible that the small voltage switching is accomplished by tip switching and the large voltage switching is accomplished by gate switching and vice versa. In this context, it is to be understood that the tip-to-gate voltage is not necessarily directly applied between the emitter tip 1 and the gate 2. Rather, different voltages can be applied between a common ground potential and emitter tip 1 and gate 2, respectively. Thus, a tip-to-gate voltage is applied which can be altered by either changing the voltage between the emitter tip 1 and ground (tip switching) or changing the voltage between the gate 2 and ground (gate switching) or by a combination of both. It should be noted that tip switching and gate switching are substantially independent from each other.

The emitter can also be formed as an array of field emission cathodes. The structure of each of the field emitters in the array is similar to the cathode shown in FIG. 1, i.e. it comprises an emitter tip and an extraction electrode. However, it is preferred for an emitter array that all emitters share at least one common electrode. In the example of FIG. 1, this can be e.g. a common extraction electrode. In this case, it is possible to switch the second, larger voltage difference simultaneously for all emitters. Thereby, variations due to a synchronous behavior of the emitters can be prevented.

Figure 2:
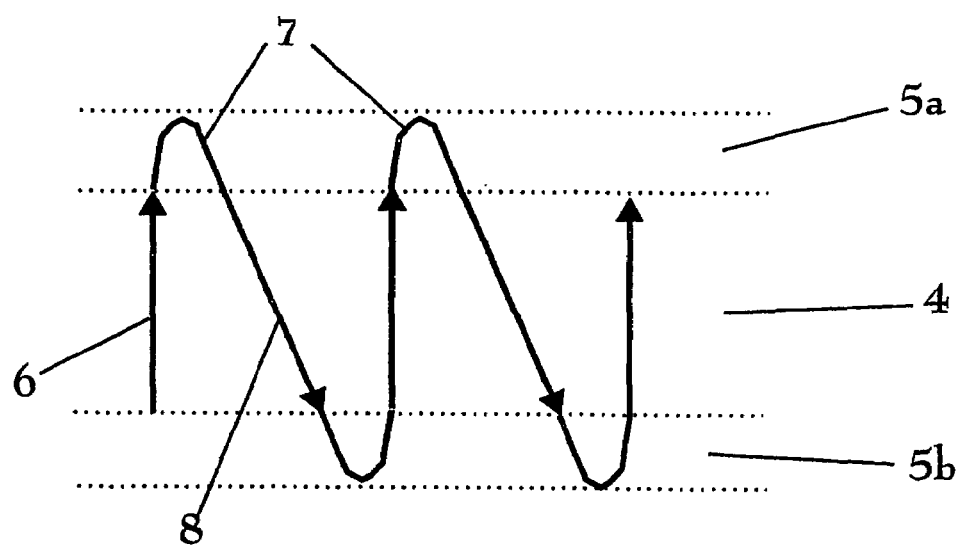
FIG. 2 shows the scan path of an electron beam spot on a sample surface.

FIG. 2 shows a trace of the electron beam on the sample surface during image writing. The sample surface has a write scan region 4, wherein the desired pattern is to be written within said write scan region 4. The electron beam moves within write scan region 4 during a pixel writing phase, thereby writing pixels on a write scan line 6. If a pixel should be written at a desired position, the tip-to-gate voltage of a respective emitter tip is switched to the "tip on" voltage level. If a pixel should be left blank, the tip-to-gate voltage of a respective emitter tip is switched to or stays at the "tip off" voltage level.

The sample surface further has upper and lower write scan turn regions 5a, 5b wherein the turning of the electron beam is performed within said write scan turn regions 5a, 5b, thereby producing write scan turns 7. After turning, the electron beam retraces and turns again, thereby producing scan retraces 8 and further write scan turns 7. Since the turns and retraces occur when the tip-to-gate voltage difference and, accordingly, also the beam current are small, the exposure dose within the upper and lower write scan turn regions 5a, 5b is low despite of the slow speed of the electron beam. Thus, CD variations or other undesired results due to residual current exposure are prevented or at least reduced.

Figure 3:
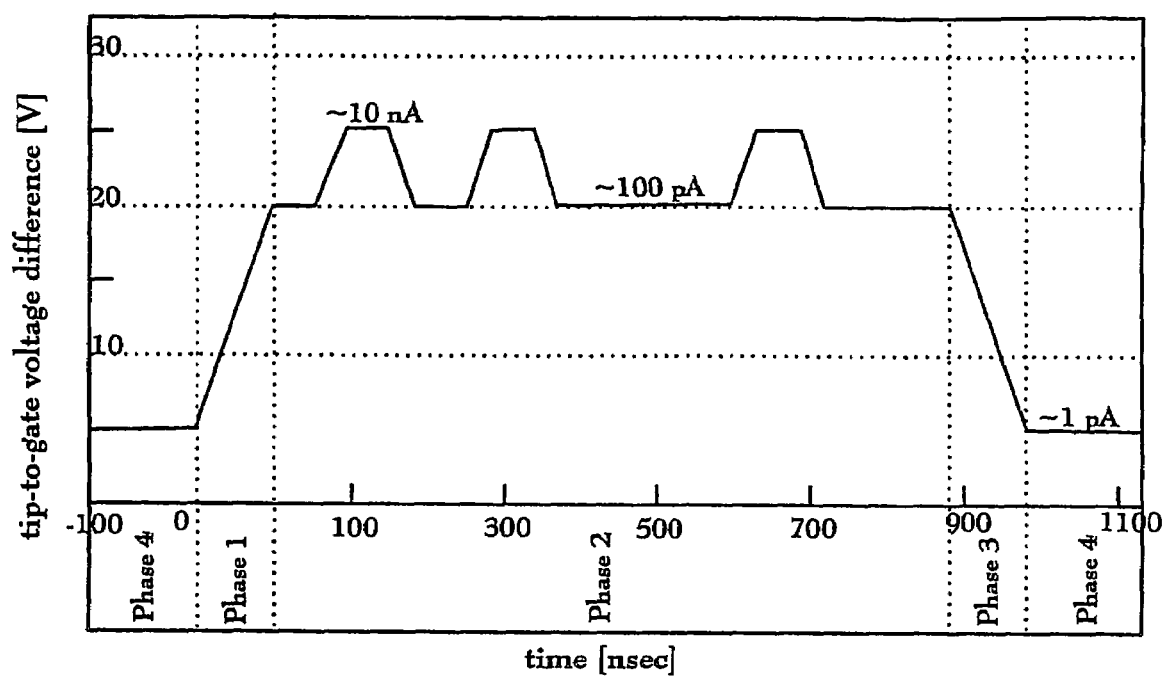
FIG. 3 shows the tip-to-gate voltage difference vs. time during a write scan cycle.

FIG. 3 shows the variation in time of the tip-to-gate voltage of an emitter tip which is operated according to an embodiment of the present invention. During a transition phase (phase 1) the electron beam reaches its full write scan speed and the tip-to-gate voltage difference starts to raise to the predefined "tip off" voltage level which is approximately 20 V in the present embodiment. Preferably, the raising of the tip-to-gate voltage occurs after the electron beam has reached its full write scan speed. By this measure, undesired exposure doses are prevented since the "tip off" current is reached not until the beam moves fast enough so that the temporarily integrated beam current is not critical.

During a pixel writing phase (phase 2) the electron beam spot moves over the sample surface at write scan speed. The tip-to-gate voltage is switched from the "tip off" level of about 20 V in the present embodiment to the "tip on" level which is about 25 V in the present embodiment. This switching can be accomplished very fast, e.g., by pulses of 1 ns duration. At the "tip on" level, the tip-to-gate voltage difference is sufficiently large so that the beam current produced by the emitter tip is high enough to expose a dose at the position of the beam spot so that the molecular composition of the resist is changed at that position. Thus, a pixel of a pattern is written onto the surface of the sample.

During a further transition phase (phase 3) the tip-to-gate voltage difference is reduced by a large amount, e.g. to 5 V, after finishing writing. The speed of the beam spot is still at the write scan speed during this phase. Finally, in a turn and retrace phase (phase 4), the tip-to-gate voltage difference stays at the low level of approximately 5 V while the spot speed slows down due to the mutual inductance of the scan coils which change their respective current direction for retrace. Subsequently, the electron beam performs a turn, a retrace and another turn with the very small residual tip current of the small tip-to-gate voltage difference. After the second turn in phase 4, the electron beams starts to speed up to reach its full write scan speed again. Now the writing process can start again.

It should be understood that the above described embodiments of the present invention, apparatus and method, are also applicable to the inspection of samples instead of pattern writing.

The invention claimed is:

1. An apparatus for producing a beam of charged particles, comprising:
   an emitter; and
   a switching device adapted to switch between first, second and third beam current levels,
   wherein the beam current at said first current level is suitable for writing a pixel of an image on a surface of a sample, the beam current at said second current level is suitable for not writing a pixel on the surface of said sample, and the beam current at said third current level is lower than the beam current at the second current level.

2. The apparatus according to claim 1, wherein said emitter is a field emission cathode and said switching device is adapted to switch between first, second and third voltage levels of an extraction voltage of said field emission cathode, wherein said first, second and third voltage levels correspond to said first, second and third current levels.

3. The apparatus according to claim 1, wherein said switching device comprises a small voltage switching part for switching between voltages having a first difference, and a large voltage switching part for switching between voltages having a second difference which is larger than said first difference.

4. The apparatus according to claim 3, wherein said first difference is smaller or equal than 5 V and said second difference is greater or equal than 10 V.

5. The apparatus according to claim 1, comprising an array of field emission cathodes.

6. The apparatus according to claim 5, further comprising an electrode common to all field emission cathodes of the array for simultaneously switching the field emission cathodes between voltages having a second difference.

7. A method for controlling a beam current of a charged particle beam comprising the steps of
switching the beam current of said charged particle beam between first and second current levels, wherein the beam current at said first current level is suitable for writing a pixel of an image on a surface of a sample and the beam current at said second current level is suitable for not writing a pixel on the surface of said sample, and
switching the beam current to a third current level, wherein the beam current at said third current level is lower than the beam current at the second current level.

8. The method according to claim 7, wherein the ratio of the beam currents of said first and second current levels is smaller than the ratio of the beam currents of said second and third current levels.

9. The method according to claim 7, wherein the ratio of the beam currents of said first and second current levels is larger or equal to $10^2$.

10. The method according to claim 7, wherein the ratio of the beam currents of said first and third current levels is larger or equal to $10^4$.

11. The method according to claim 7, wherein said first current level is at 10 nA, said second current level is at 0.1 nA, and said third current level is at 1 pA.

12. The method according to claim 7, wherein the beam current is at the third current level when the charged particle beam performs a turn movement and/or a retrace movement.

13. The method according to claim 7, wherein the switching between said second and third current levels is performed when the charged particle beam moves over the surface at write scan speed.

14. A method for controlling a beam current of a charged particle beam comprising the steps
producing the charged particle beam by a field emission cathode,
switching an extraction voltage of said field emission cathode between first and second voltage levels, wherein said first voltage level is suitable for writing a pixel of an image on a surface of a sample and said second voltage level is suitable for not writing a pixel on the surface of said sample, and
switching the extraction voltage to a third voltage level, wherein said third voltage level is lower than said second voltage level.

15. The method according to claim 14, wherein the voltage difference between the first and second voltage levels is smaller than the difference between the second and third voltage levels.

16. The method according to claim 14, wherein the voltage difference between the first and second voltage level is smaller or equal than 5 V and the voltage difference between the second and third voltage level is greater or equal than 10 V.

17. The method according to claim 14, wherein the third voltage level is at about 5 V.

18. The method according to claim 14, wherein the extraction voltage is at the third voltage level when the charged particle beam performs a turn movement and/or a retrace movement.

19. The method according to claim 14, wherein the switching between said second and third voltage levels is performed when the charged particle beam moves over the surface at write scan speed.

20. The method according to claim 14, wherein the switching between any of the first, second and third voltage levels is performed by tip switching.

21. The method according to claim 14, wherein the switching between any of the first, second and third voltage levels is performed by gate switching.

* * * * *